United States Patent
Lin

[19]

[11] Patent Number: 6,081,436
[45] Date of Patent: Jun. 27, 2000

[54] MULTI-OUTPUT POWER SUPPLY VOLTAGE SENSING

[75] Inventor: Feng Lin, Plano, Tex.

[73] Assignee: Lucent Technologies, Inc., Murray Hill, N.J.

[21] Appl. No.: 09/132,955

[22] Filed: Aug. 12, 1998

[51] Int. Cl.[7] .................................................. H02M 7/00
[52] U.S. Cl. ............................................................ 363/65
[58] Field of Search ................................ 363/65, 67, 69, 363/71, 39, 40, 44

[56] References Cited

U.S. PATENT DOCUMENTS 3,725,678  4/1973  Reddy ........................................ 307/264
5,268,595  12/1993  Ohshima ................................. 307/362
5,537,024  7/1996  Lang ......................................... 320/48

Primary Examiner—Matthew Nguyen
Attorney, Agent, or Firm—Locke Liddell & Sapp LLP

[57] ABSTRACT

A multi-output power supply voltage sensing method and apparatus with increased static efficiency over prior art are disclosed. The method and apparatus employ resistance in the negative sensing wire to alleviate electromagnetic interference. The method and apparatus can change the output voltage set point of the power stage, canceling or changing the output voltage setpoint shift is also disclosed.

8 Claims, 4 Drawing Sheets

MULTI-OUTPUT POWER SUPPLY VOLTAGE SENSING

This invention relates to multiple-output DC power supplies. More specifically, to an output voltage sensing technique that allows DC power supply output voltage to be accurately sensed without greatly increasing the space occupied by the power supply or inducing an electromagnetic field.

BACKGROUND OF THE INVENTION

Multiple output DC power supplies often are used to provide voltage to microchips and other circuit board components. Such components are sensitive to small variations in voltage; therefore, it is important that power supply voltage be carefully monitored and regulated.

In a single-output power supply, voltage may be monitored directly across the load. However, in a multi-output power supply, the negative rails of each output are connected to a common ground. The use of a common ground, while desirable to prevent damage to components, can allow different currents running to the common ground to generate strong electromagnetic interference (EMI) noise.

To alleviate the induced EMI, an operational amplifier is often used for differential sensing of the second output. The op amp blocks the loop current path, preventing EMI. Although this method is effective, as devices have been miniaturized, less space has been allocated to all parts of the device, including the power supply. Using an op amp requires at least 0.2 square inches of space. As the space allocated to the power supply is being reduced to 3.3 square inches or less, use of an op amp is becoming impractical.

What is needed is a scheme that provides for precise voltage monitoring which uses less space than an op amp, thereby permitting greater static efficiency.

SUMMARY OF THE INVENTION

The present invention describes a voltage sensing method which minimizes EMI while providing static efficiency, which refers to the ability to place this power supply in a small amount of space. The present invention can be implemented in 0.04 square inches of area, allowing for the further micronization of power supplies.

The voltage sensing method of the present invention adds a resistance to each connection between each load and the common ground of the power supply, allowing the voltage to be measured across each load. The added resistance drops the current level running to the common ground, thereby weakening the electromagnetic field induced by the current.

The addition of resistance in the ground line will slightly shift the output voltage setpoint. However, the shift can be cancelled altogether by selecting a sense resistor Rs such that:

$$Rs = R2 * Vp/Vr$$

wherein R2=a protion of the resistance inherent to the power supply and selected for the particular output voltage, Vp=potential voltage between two load grounds and Vr=reference voltage.

The shift resistor can also be used to improve the output voltage setpoint by intentionally shifting it.

The features and advantages of the invention will become more readily understood from the following detailed description taken in conjunction with the appended claims and attached drawing wherein:

DESCRIPTION OF THE INVENTION

Figure 1:
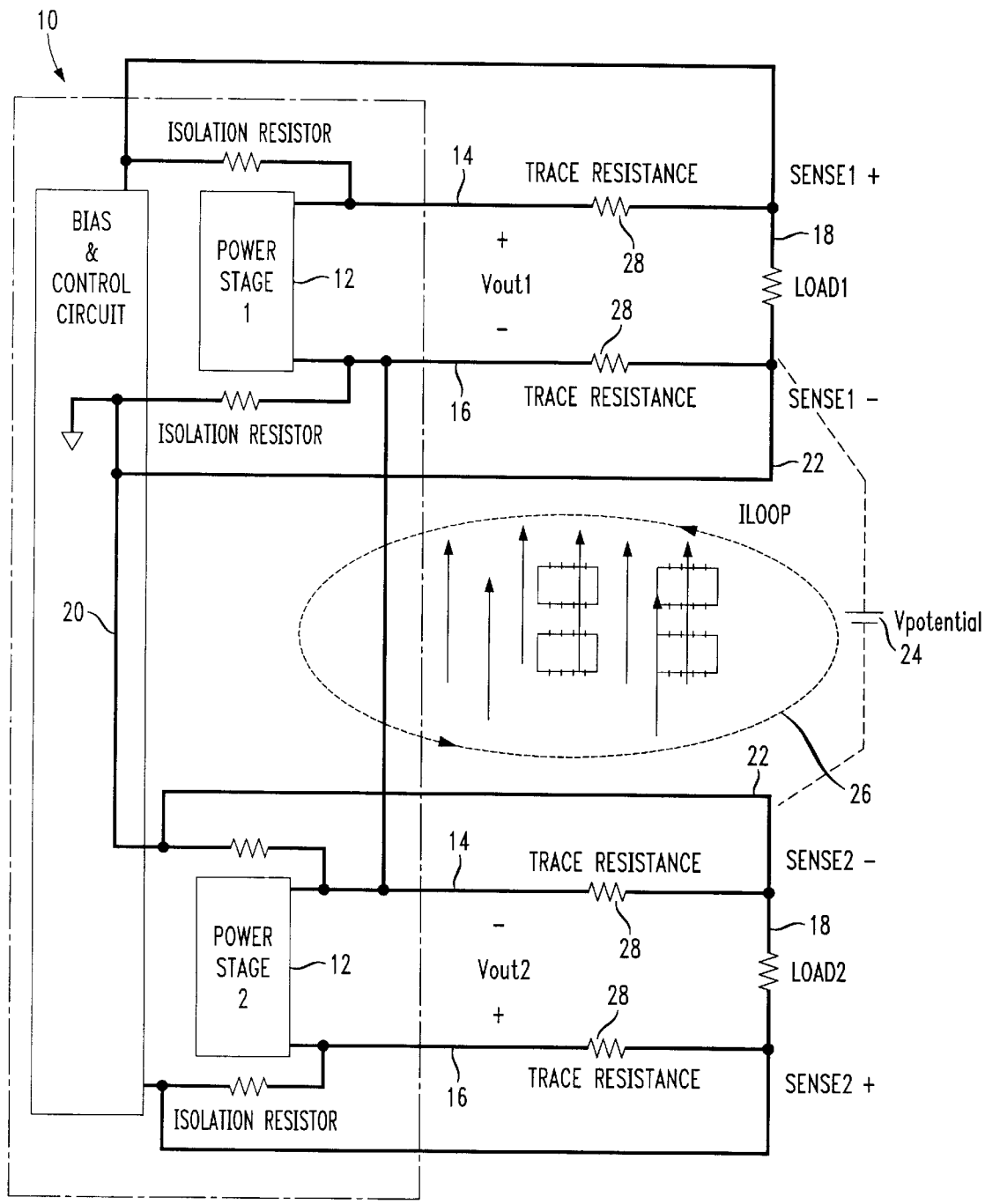
FIG. 1 is a circuit diagram of a dual output power supply of the prior art.

Referring now to FIG. 1, a circuit diagram of a dual output supply 10 is shown. The power stages 12 have positive 14 and negative 16 line outs to attach to a load 18. The negative lines 16 of the power stages 12 are attached to a common ground 20 via a grounding wire 22. It is common to monitor the voltage across the loads 18. However, because the current outputs of the stages 12 are different, there is a voltage potential 24 around the loop 26 including the grounding wires 22 and the common ground 20. Although this voltage potential 24 may be small, the lines have only a trace resistance 22. Consequently, dividing a few milli-Volts of voltage potential 24 caused by the differential by a few milliOhms of trace resistance 22 in the loop 26 can easily equate to almost 1 Amp of residual current. A current of this magnitude in a small area of a device can induce a strong electromagnetic field, causing devices near this loop current to malfunction.

Figure 2:
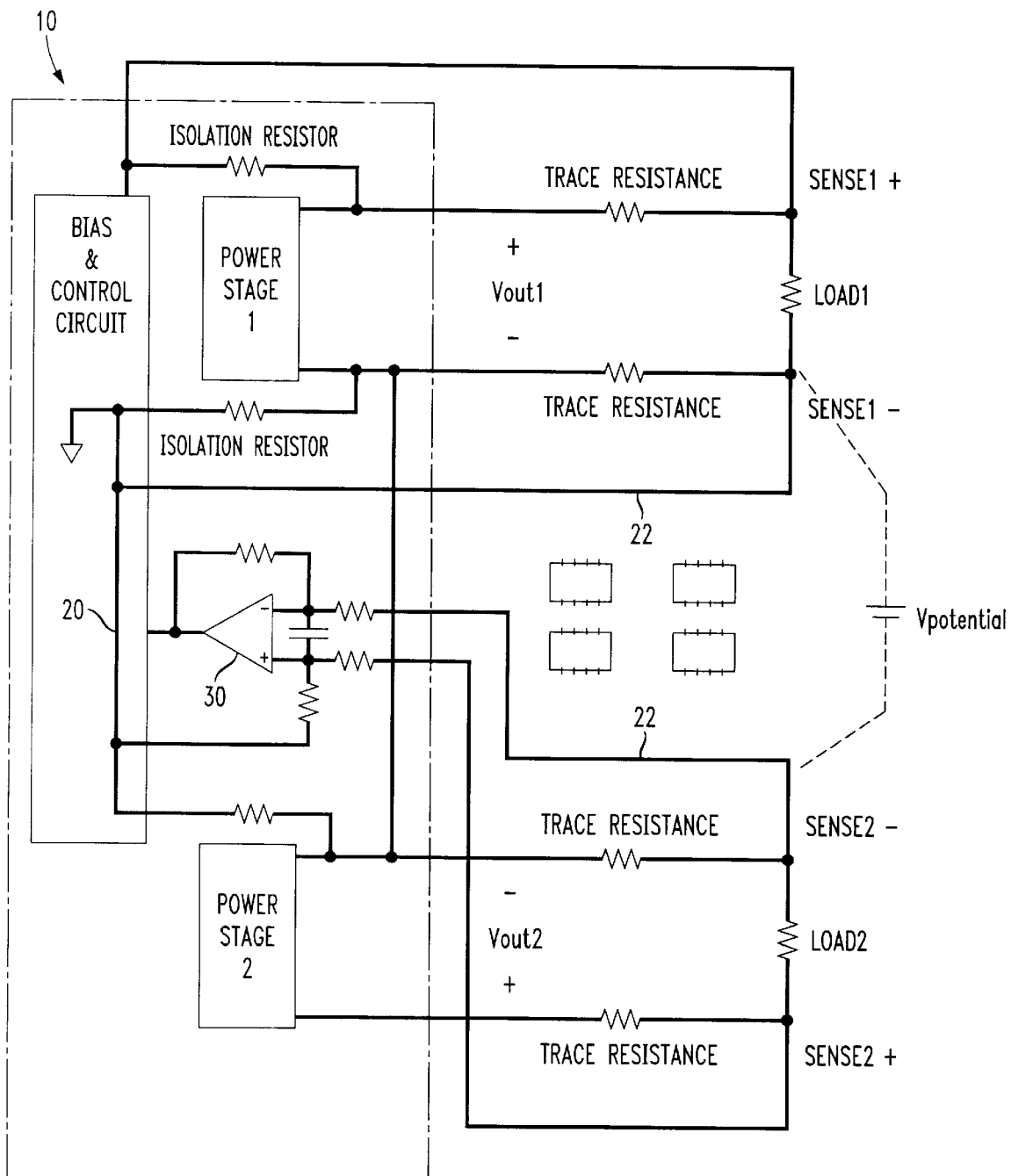
FIG. 2 is a circuit diagram of a dual output power supply of the prior art having operational amplifier differential sensing.

Referring now to FIG. 2, a conventional method of preventing EMI caused by a ground wire loop is shown. In FIG. 2, a differential operational amplifier 30 has been inserted between the grounding wires 22 and the common ground 20. The op amp 30 prevents the grounding wires 22 and the common ground 20 from forming a loop, thereby preventing an electromagnetic field from being generated. This conventional method is widely used.

However, the space occupied by the op amp becomes a concern when power supplies are miniaturized. In one current protoboard design, 3.3 square inches of space is allotted for the power supply. The voltage sensing device, which includes an op amp, requires 0.2 square inches, which is 6.1% of the space allocated. This space requirement becomes nearly impractical when multi-output designs are built on a single board.

Figure 3:
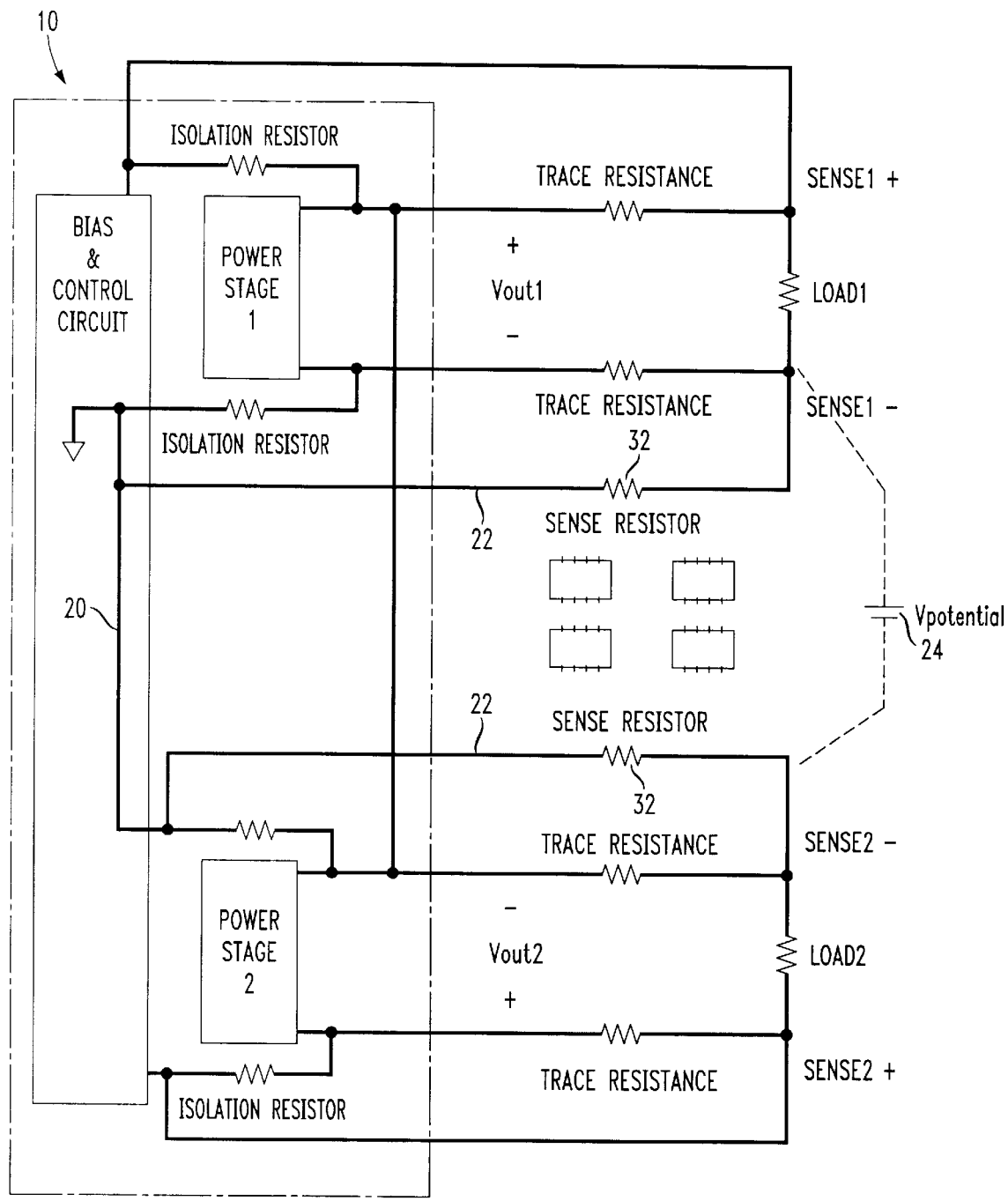
FIG. 3 is a circuit diagram of a dual output power supply with voltage sensing according to the present invention.

Referring now to FIG. 3, a circuit diagram of the present invention is shown. In the present invention, a resistor 32 is added to the grounding wire 22. The loop created by the grounding wires 22 and the common ground 20 exists as in FIG. 1, but the added resistance 32 means that the milliVolts of potential voltage 24 are now divided by Ohms of resistance, resulting in a current in the order of one milli-Amp or less. The EMI created by currents of this low order of magnitude do not create a concern.

The technique of the present invention yields much static efficiency, as resistors do not occupy much board space. In a power supply allocated 3.3 in$^2$ of space, the present invention can be practiced using 0.04 in$^2$ of board space, a significant advantage over an op amp.

However, the technique of the present invention can slightly shift the output voltage setpoint.

Figure 4:
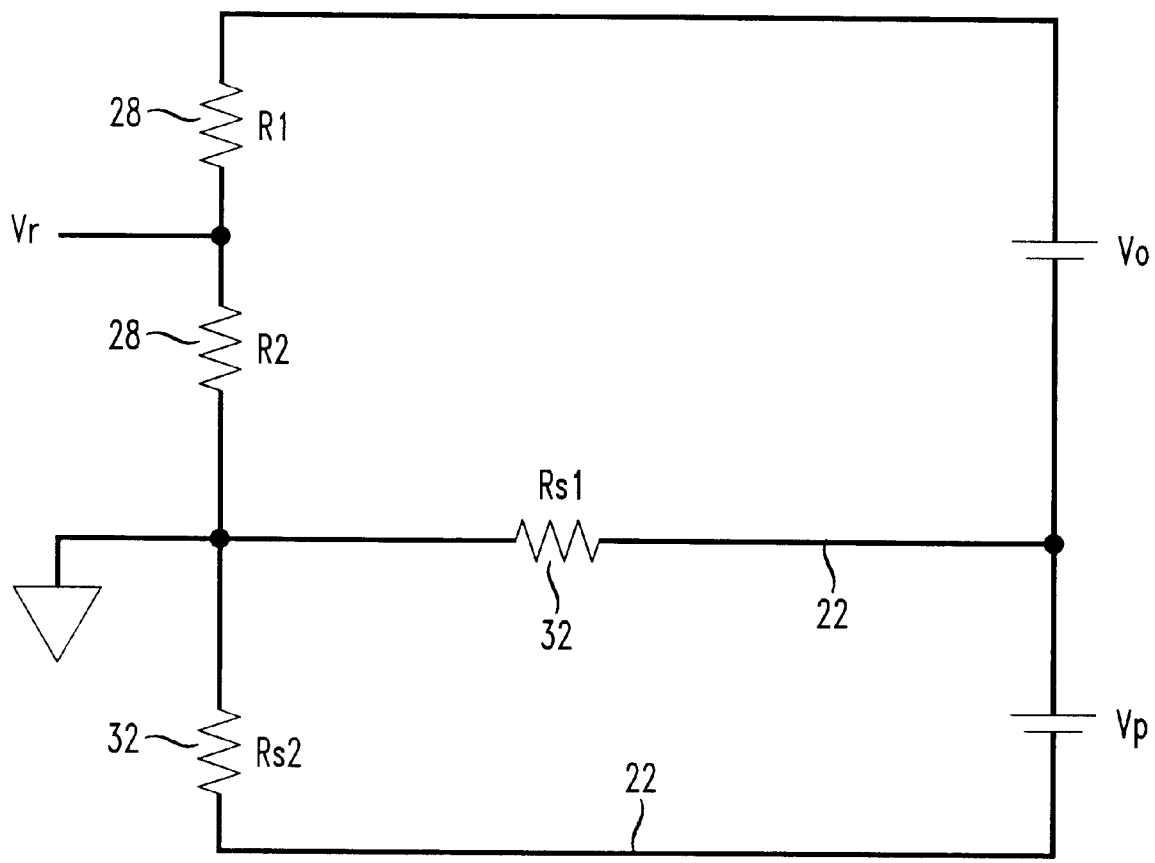
FIG. 4 is an equivalent output circuit of the sensing ground loop.

Referring now to FIG. 4, an equivalent circuit to a particular power stage of dual outputs employing the present invention is shown. In the equivalent circuit, R1 and R2 are the voltage divider of existing internal voltage sensing circuit. The resistance 32 are added to the sensing grounding line 22 of both stages to reduce the ground loop current in sensing ground wire. For simplicity, all added resistances 32 are selected to be the same. It can then be shown that:

$$Vo(Rs)=Vr*(R1+R2)/R2+(Rs*Vr-R2*Vp)/2R2$$

From this equation, it can be seen that the second item on the right side is extraneous and defines the output voltage shift. This equation can be manipulated to change the setpoint shift by changing Rs. For example, the second item can be canceled if Vp is known, by selecting Rs such that:

$$Rs=(R2*Vp)/Vr.$$

It is to be understood that although the invention has been described with particular reference to specific embodiments thereof, the form of the invention shown and described in detail is to be taken as the preferred embodiment of same, and that various changes and modifications may be resorted to without departing from the spirit and scope of the invention as defined by the appended claims.

I claim:

1. A voltage sensing method for sensing the output voltage of each stage of a multiple-output power supply having multiple loads connected to a common ground, a reference voltage Vr and two output stages, said output stages comprising a voltage output having a voltage node, an output side on one side of said voltage node and a ground side on the other side of said voltage node, and preset resistances R1 and R2 determined by the output voltage, wherein R1 represents the resistance on the output side and R2 represents the resistance on the ground side, comprising:

a) adding a resistance between each load and the common ground;
   b) measuring the voltage across each load; and
   c) canceling output voltage shift by selecting the amount of resistance to be added to each output stage according to the equation:

$$Rs=R2*Vp/Vr$$

wherein Vp=potential voltage between low voltage outputs of output stages.

2. The voltage sensing method of claim 1 further comprising the step of preselecting said resistance to change output voltage shift.

3. An improvement for a multi-output power supply having multiple outputs, each such output having a positive side and a negative side, with each output being connected to a common ground, the power supply having a reference voltage input Vr and two output stages, said output stages comprising a voltage output having a voltage node, an output side on one side of said voltage node and a ground side on the other side of said voltage node, and preset resistances R1 and R2 determined by the output voltage, wherein R1 represents the resistance on the output side and R2 represents the resistance on the ground side, the improvement comprising the addition of a predetermined resistance in the negative side of each output selected to cancel the output voltage shift according to the equation:

$$Rs=R2*Vp/Vr$$

wherein Vp=potential voltage between low voltage outputs of output stages.

4. The improvement of claim 3 wherein said predetermined resistance is selected based upon improving the effect of the resistance upon the output voltage.

5. The improvement of claim 3 wherein said predetermined resistance added in the negative side of each output sensing wire can be the same amount, or different, for each output.

6. A multi-output power supply having a reference voltage input Vr and two output stages, said output stages comprising a voltage output having a voltage node, an output side on one side of said voltage node and a ground side on the other side of said voltage node, and preset resistances R1 and R2 determined by the output voltage, wherein R1 represents the resistance on the output side and R2 represents the resistance on the ground side, comprising:

a plurality of power stages, each power stage comprising a preselected voltage output having a high-voltage end and a ground end;
   a sense resistor in each power stage, each sense resistor having a first end and a second end, said first end of each sense resistor connected to the ground end of each load;
   a common ground rail connected to the second end of each sense resistor; and
   wherein the value of each sense resistor is selected to cancel output voltage shift as determined by the equation:

$$Rs=R2*Vp/Vr$$

wherein Vp=potential voltage between low voltage outputs of output stages.

7. The multi-output power supply of claim 6 wherein the value of each sense resistor is predetermined to change its effect upon the voltage output of each power stage.

8. The multi-output power supply of claim 6 wherein said predetermined resistance added between the negative side of each load and the common ground is the same amount, or different, for each output.

* * * * *